(12) United States Patent
Ikoma et al.

(10) Patent No.: US 6,492,849 B2
(45) Date of Patent: Dec. 10, 2002

(54) SUPPLY VOLTAGE DETECTION CIRCUIT

(75) Inventors: Heiji Ikoma, Nara (JP); Yoshitsugu Inagaki, Osaka (JP); Koji Oka, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/820,842

(22) Filed: Mar. 30, 2001

(65) Prior Publication Data

US 2001/0030558 A1 Oct. 18, 2001

(30) Foreign Application Priority Data

Apr. 14, 2000 (JP) ........................................ 2000-113733

(51) Int. Cl.[7] .............................. G05F 3/08; H03L 7/00
(52) U.S. Cl. ..................... 327/143; 327/544; 327/198
(58) Field of Search ................................. 327/142, 143, 327/198, 544, 538

(56) References Cited

U.S. PATENT DOCUMENTS

| | | | |
|---|---|---|---|
| 5,440,254 A | * 8/1995 | Sundby | 327/79 |
| 5,489,946 A | 2/1996 | Kommrusch et al. | |
| 5,576,842 A | 11/1996 | Choi | |
| 5,610,576 A | 3/1997 | Su | |
| 5,703,475 A | * 12/1997 | Lee et al. | 327/538 |
| 5,831,302 A | * 11/1998 | McIntyre | 365/226 |
| 5,969,549 A | 10/1999 | Kim et al. | 327/143 |
| 6,118,295 A | 9/2000 | Murayama et al. | 324/771 |
| 6,147,521 A | * 11/2000 | Degoirat et al. | 327/206 |
| 6,236,249 B1 | * 5/2001 | Choi et al. | 327/143 |

FOREIGN PATENT DOCUMENTS

EP     0 127 139     12/1984

OTHER PUBLICATIONS

"A CMOS Band–Gap Reference Circuit with Sub 1V Operation", by Banba et al., 1998 Symposium on VLSI Circuits Digest of Technical Papers, pp. 228–229.

* cited by examiner

Primary Examiner—Timothy P. Callahan
Assistant Examiner—Terry L. Englund
(74) Attorney, Agent, or Firm—McDermott, Will & Emery

(57) ABSTRACT

A monitor circuit for supplying a detection voltage reflecting a supply voltage, a reference voltage generation circuit for generating a high-precision reference voltage not depending upon the supply voltage, and a comparator for comparing the detection voltage with the reference voltage and outputting the result of the comparison are provided and, in addition, a controller is provided which is made up of an auxiliary reference voltage generation circuit for generating a low-precision auxiliary reference voltage with less power dissipation and an auxiliary comparator for comparing the detection voltage with the auxiliary reference voltage. The auxiliary reference voltage is set higher than the reference voltage, and when the detection voltage becomes higher than the auxiliary reference voltage to cause the comparison output of the auxiliary comparator to become active, the reference voltage generation circuit is placed in a power-down state, thereby achieving a reduction in current dissipation.

9 Claims, 6 Drawing Sheets

US 6,492,849 B2

SUPPLY VOLTAGE DETECTION CIRCUIT

BACKGROUND OF THE INVENTION

The present invention relates to a supply voltage detection circuit for detecting supply voltage levels.

Recently, many of the processors, such as microcomputers designed for portable equipment, are equipped with a supply voltage detection circuit supply voltage detection circuits find application in detecting the life of a battery, the voltage of a capacitor power source used in a backup mode and so on. In addition to these detection applications, supply voltage detection circuits have been used extensively for generating signals such as a reset signal for initializing the system when the power is turned on and a reset signal for preventing the system from getting out of control when there occur variations in power supply.

A typical supply voltage detection circuit is comprised of a monitor circuit for supplying a detection voltage Vdet reflecting a supply voltage Vdd, a reference voltage generation circuit for generating a given reference voltage Vref not depending upon the supply voltage Vdd, and a comparator for comparing the detection voltage Vdet with the reference voltage Vref and outputting the result of the comparison. For example, the monitor circuit is formed by a resistive potential division circuit which produces the detection voltage Vdet proportional to the supply voltage Vdd. BGR (Band-Gap Reference) circuits have been known in the art as one type of the reference voltage generation circuit. With the BGR circuit, the reference voltage Vref can be obtained with high precision, as shown by Banba et al. in their report entitled "A CMOS Band-Gap Reference Circuit with Sub 1V Operation", 1998 Symposium on VLSI Circuits, Digest of Technical Papers, pp. 228–229. On the other hand, a reference voltage generation circuit of lower precision than the BGR circuit has also been known in the art. Such a low-precision circuit is shown in U.S. Pat. No. 5,969,549 to Kim et al.

However, in the above prior art technique, the monitor circuit, the reference voltage generation circuit, and the comparator are all in the operating state at all times. Therefore, the problem of large power dissipation arises. Particularly, when employing a BGR circuit as a reference voltage generation circuit, such a power dissipation problem becomes much serious.

SUMMARY OF THE INVENTION

Accordingly, an object of the present invention is to provide a supply voltage detection circuit capable of high detection precision/low power dissipation compatibility.

In order to achieve the above object, the present invention provides a supply voltage detection circuit which employs a configuration comprising a monitor circuit for supplying a detection voltage reflecting a supply voltage, a reference voltage generation circuit for generating a reference voltage, and a comparator for comparing the detection voltage with the reference voltage and outputting the result of the comparison, wherein a first voltage range including the reference voltage and a second voltage range different from the first voltage range are set, and wherein the supply voltage detection circuit further comprises control means for performing control so that the current dissipation of the reference voltage generation circuit is reduced when the detection voltage falls within the second voltage range in comparison with when the detection voltage falls within the first voltage range.

DETAILED DESCRIPTION OF THE INVENTION

Figure 1:
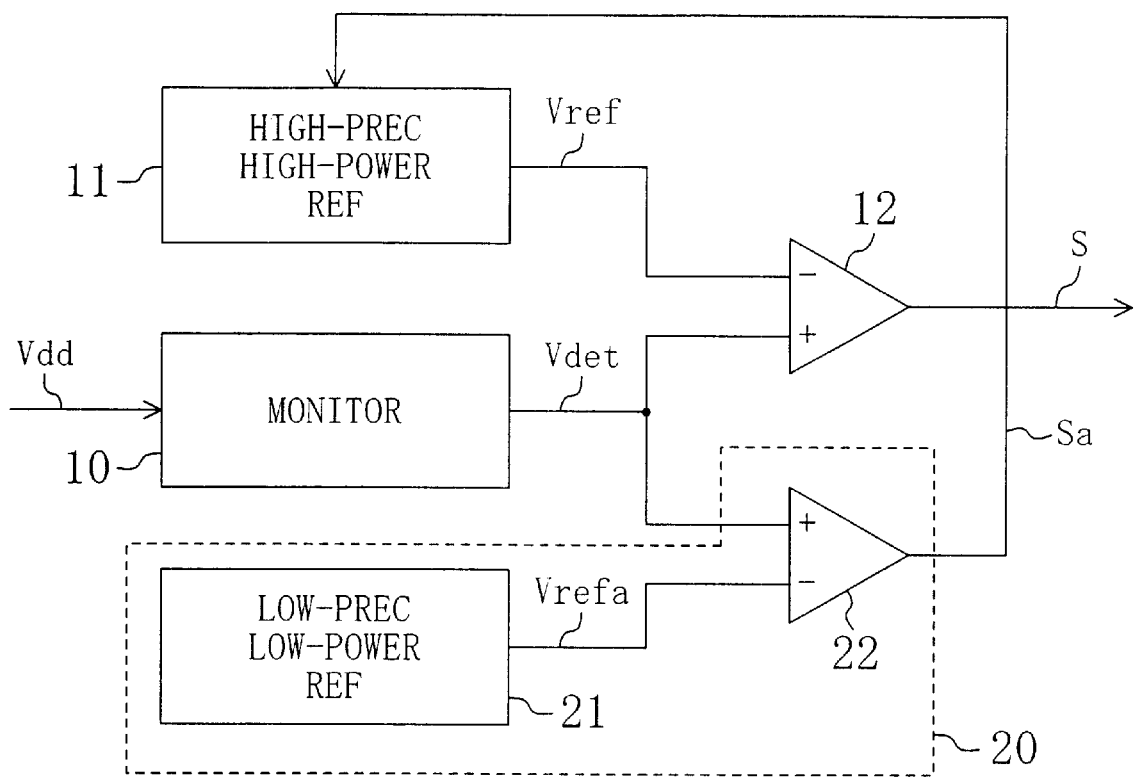
FIG. 1 is a block diagram showing, by way of example, a first arrangement of a supply voltage detection circuit according to the present invention.

FIG. 1 shows a first example arrangement of a supply voltage detection circuit according to the present invention. The supply voltage detection circuit of FIG. 1 has a monitor circuit 10 for supplying a detection voltage Vdet reflecting a supply voltage Vdd, a reference voltage generation circuit 11 for generating a given reference voltage Vref not depending upon the supply voltage Vdd, and a comparator 12 for comparing the detection voltage Vdet with the reference voltage Vref and outputting the result of the comparison as a comparison output S. In addition to these components, the supply voltage detection circuit further has a controller 20. The monitor circuit 10 is formed by a circuit such as a resistive potential division circuit so that the detection voltage Vdet proportional to the supply voltage Vdd is generated. The reference voltage generation circuit 11 is formed by a circuit such as a BGR so that the high-precision reference voltage Vref is generated although power dissipation is high. The controller 20 has an auxiliary reference voltage generation circuit 21 for generating an auxiliary reference voltage Vrefa whose power dissipation is lower than the reference voltage generation circuit 11 and an auxiliary comparator 22 for comparing the detection voltage Vdet with the auxiliary reference voltage Vrefa. The operation of the reference voltage generation circuit 11 is controlled according to an auxiliary comparison output Sa indicative of the result of the comparison by the auxiliary comparator 22. More concretely, if the auxiliary comparison output Sa indicates "L", the reference voltage generation circuit 11 operates. On the other hand, if the auxiliary comparison output Sa indicates "H", the reference voltage generation circuit 11 enters the power-down state and the comparison output S of "H" is held. There is dissipated little power in the reference voltage generation circuit 11 when it enters the power-down state. As the auxiliary reference voltage generation circuit 21, the low-precision, low power dissipation circuit of the aforesaid Kim et al. patent can be employed.

Figure 2A:
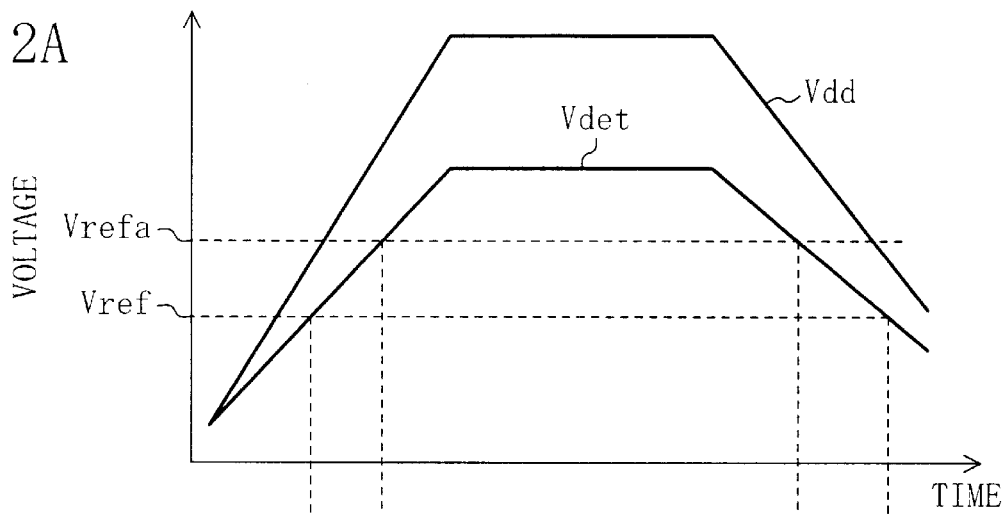
FIGS. 2A–C are operation timing diagrams of the supply voltage detection circuit of FIG. 1.
Figure 2B:
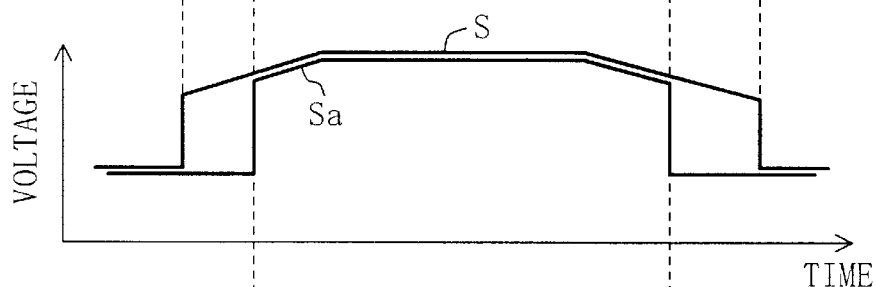
Figure 2C:
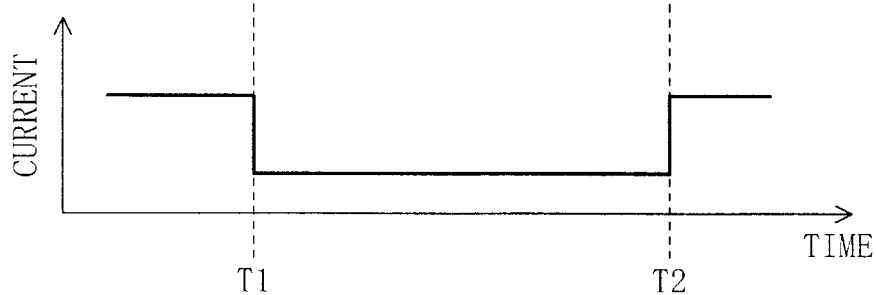

Referring to FIGS. 2A–C, there is shown the operation of the supply voltage detection circuit of FIG. 1. The detection voltage Vdet follows and varies with the supply voltage Vdd (FIG. 2A). As long as the auxiliary comparison output Sa is "L", the comparison output S is "L" if the detection voltage Vdet is lower than the reference voltage Vref and the comparison output S is "H" if the detection voltage Vdet is higher than the reference voltage Vref (FIG. 2B). In this way, the level of the supply voltage Vdd is detected based on the high-precision reference voltage Vref generated by the reference voltage generation circuit 11. On the other hand, as shown in FIG. 2A, the auxiliary reference voltage Vrefa is set higher than the reference voltage Vref, and when the detection voltage Vdet becomes higher than the auxiliary reference voltage Vrefa, the auxiliary comparison output Sa becomes "H" (FIG. 2B). In this way, when the auxiliary comparison output Sa becomes "H", the reference voltage generation circuit 11 enters the power-down state and the comparison output S of "H" is held. This accordingly reduces the current dissipation of the reference voltage generation circuit 11 during the period from time T1 to time T2 (FIG. 2C).

As described above, with the arrangement of FIG. 1, a first voltage range (<Vrefa) including the reference voltage Vref and a second voltage range (>Vrefa) different from the first voltage range are set, and when the detection voltage Vdet falls within the second voltage range, the current dissipation of the reference voltage generation circuit 11 is reduced in comparison with when the detection voltage Vdet falls within the first voltage range. This therefore realizes a supply voltage detection circuit capable of high detection precision/low power dissipation compatibility.

Figure 3:
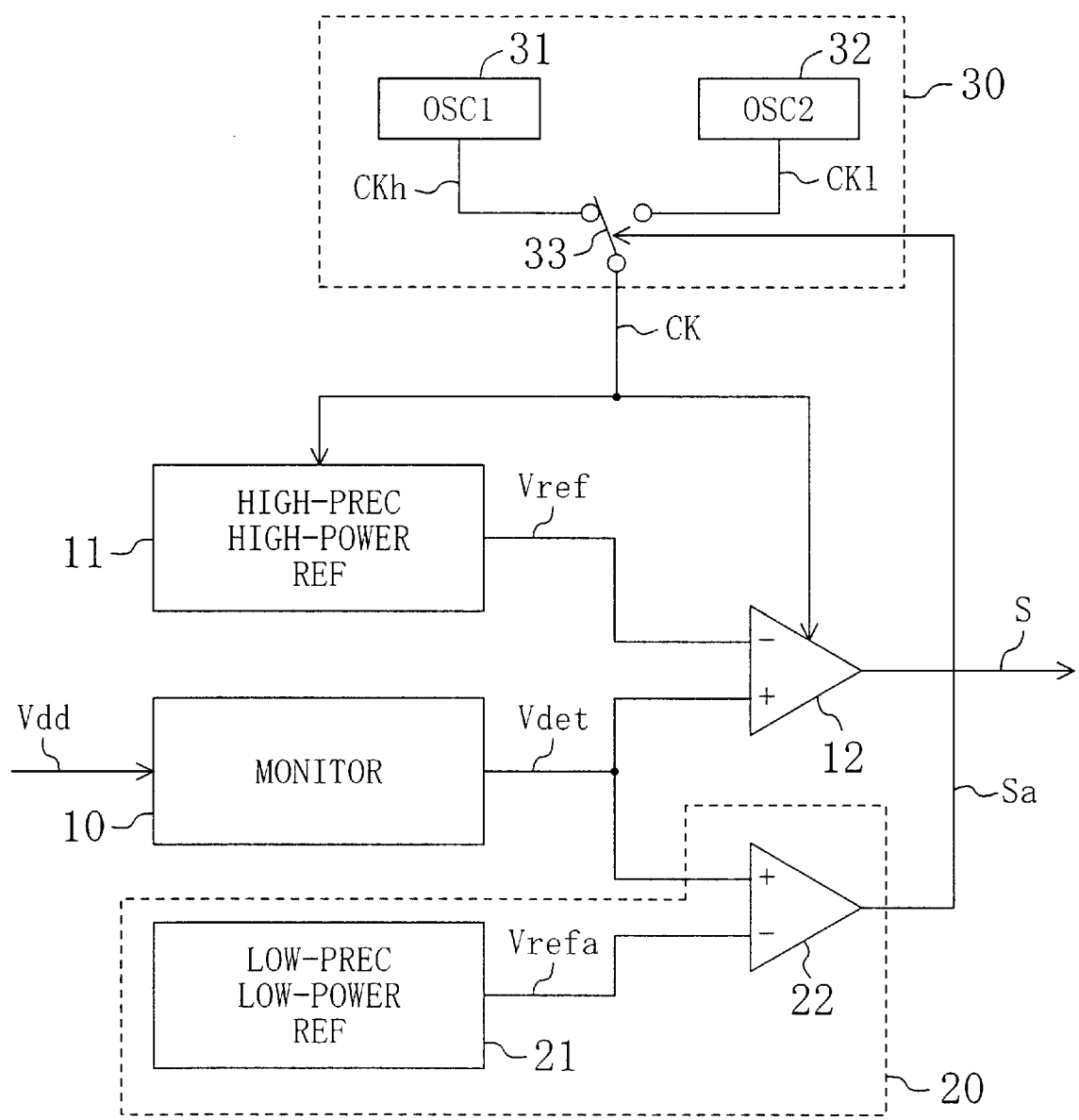
FIG. 3 is a block diagram showing, by way of example, a second arrangement of the supply voltage detection circuit according to the present invention.

Referring to FIG. 3, there is shown a second example arrangement of the supply voltage detection circuit of the present invention. The supply voltage detection circuit of FIG. 3 is formed by adding to the arrangement of FIG. 1 an oscillator 30 for generating a clock signal CK so that the reference voltage generation circuit 11 and the comparator 12 operate intermittently at a frequency according to the result of the comparison by the auxiliary comparator 22. The oscillator 30 is made up of a first clock generator 31 for generating a high frequency clock signal CKh, a second clock generator 32 for generating a low frequency clock signal CKl, and a switch 33 for selecting between the first clock generator 31 and the second clock generator 32 according to the auxiliary comparison output Sa. More concretely, when the auxiliary comparison output Sa is "L", then CK=CKh. On the other hand, when the auxiliary comparison output Sa is "H", then CK=CKl. Further, in the period during which the clock signal CK is "H", the reference voltage generation circuit 11 and the comparator 12 operate. On the other hand, in the period during which the clock signal CK is "L", the reference voltage generation circuit 11 and the comparator 12 are placed in the power-down state and the comparison output S of "H" is held.

Figure 4A:
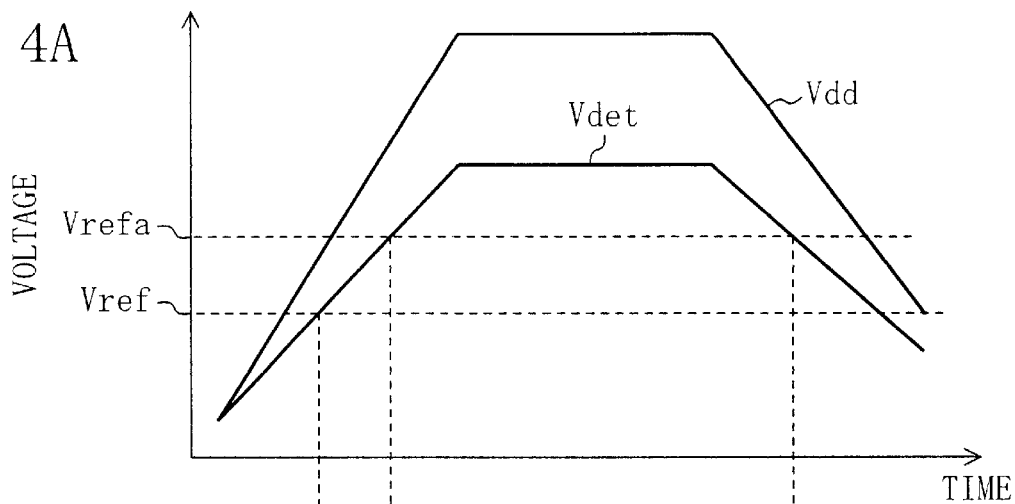
FIGS. 4A–D are operation timing diagrams of the supply voltage detection circuit of FIG. 3.
Figure 4B:
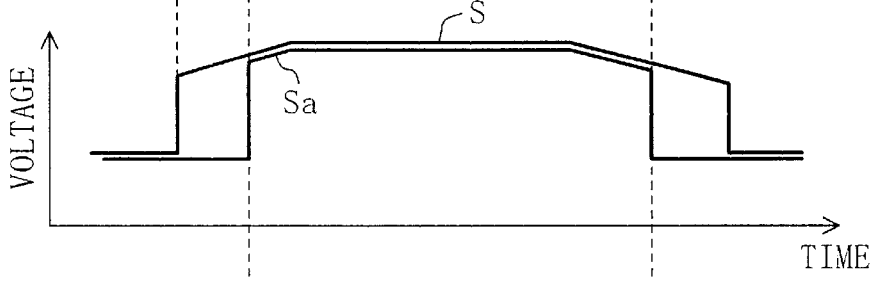
Figure 4C:
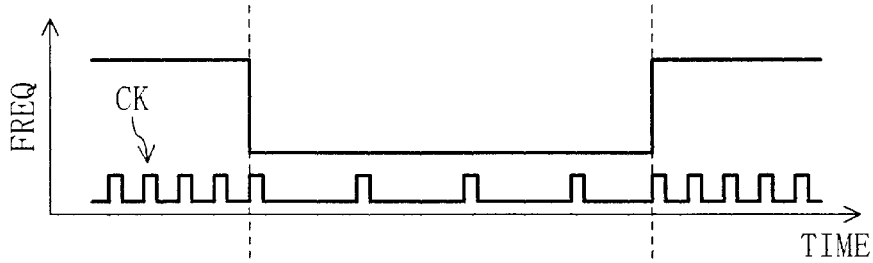
Figure 4D:
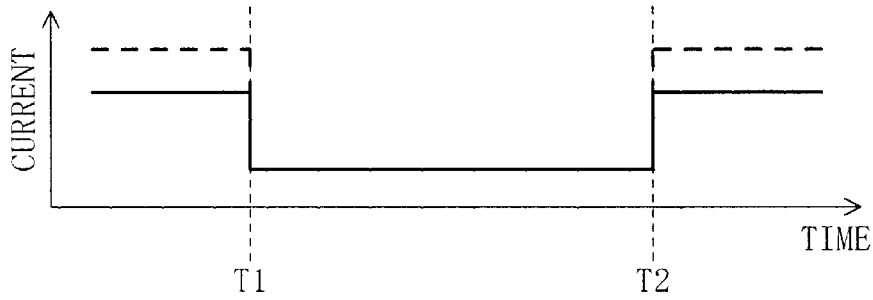

FIGS. 4A–D show the operation of the supply voltage generation circuit of FIG. 3. FIGS. 4A and B are the same as FIGS. 2A and B. The reference voltage generation circuit 11 and the comparator 12 operate intermittently at all times according to the clock signal CK shown in FIG. 4C. Furthermore, when the detection voltage Vdet becomes higher than the auxiliary reference voltage Vrefa and the auxiliary comparison output Sa becomes "H", the periodic time of the intermittent operation increases. Therefore, with the arrangement of FIG. 3, the current dissipation is further reduced in comparison with the arrangement of FIG. 1, as shown in FIG. 4D. An arrangement can be made to the oscillator 30 of FIG. 3, in which the oscillation frequency of a single clock generator is varied according to the auxiliary comparison output Sa.

Figure 5:
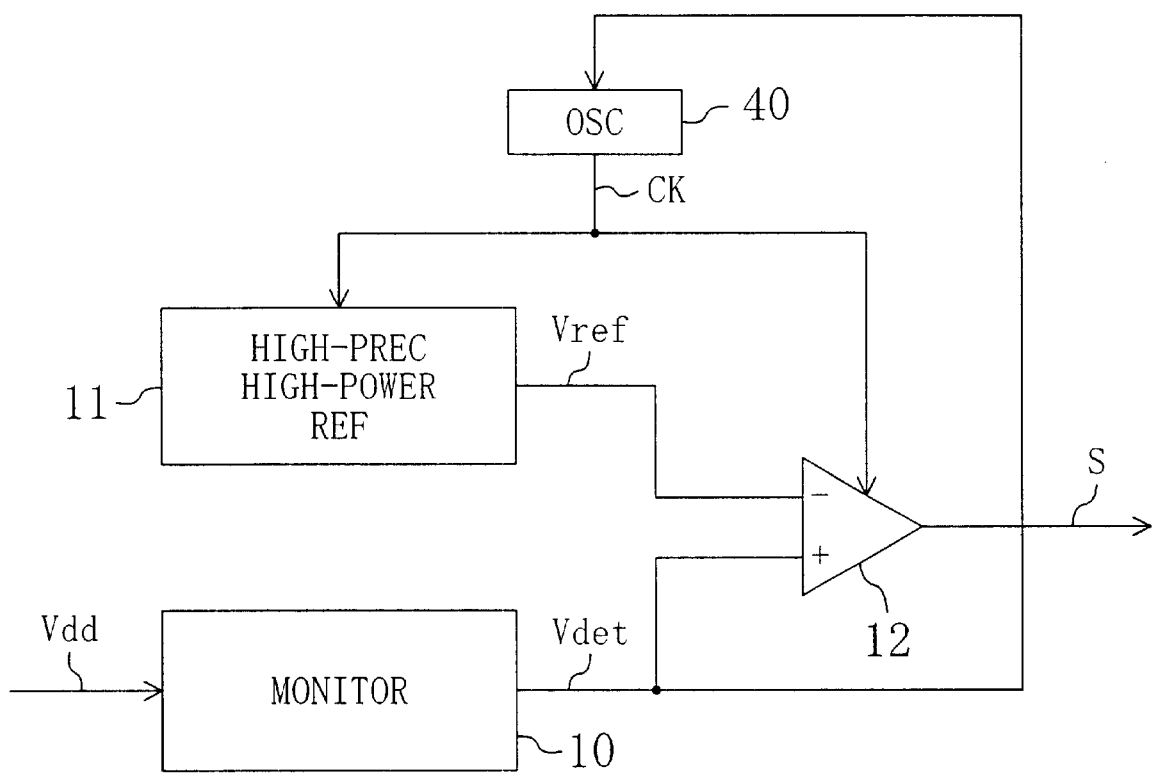
FIG. 5 is a block diagram showing, by way of example, a third arrangement of the supply voltage detection circuit according to the present invention.

Referring to FIG. 5, there is shown a third example arrangement of the supply voltage detection circuit of the present invention. The supply voltage detection circuit of FIG. 5 has, in addition to the monitor circuit 10, the reference voltage generation circuit 11, and the comparator 12 in FIG. 1, an oscillator 40 for generating a clock signal CK so that the reference voltage generation circuit 11 and the comparator 12 operate intermittently at a frequency inversely proportional to the detection voltage Vdet of the monitor circuit 10. More concretely, in the period during which the clock signal CK is "H", the reference voltage generation circuit 11 and the comparator 12 operate. On the other hand, in the period during which the clock signal is "L", the reference voltage generation circuit 11 and the comparator 12 are placed in the power-down state and the comparison output S of "H" is held.

Figure 6A:
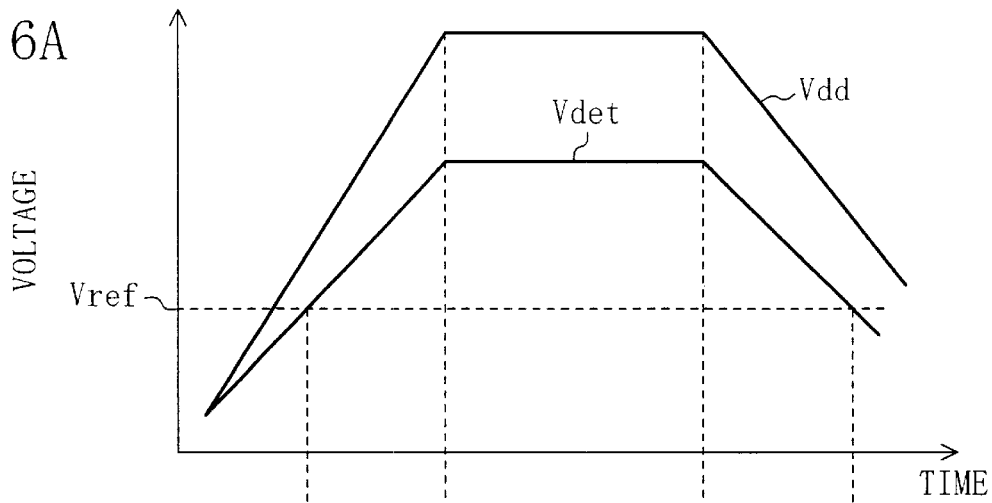
FIGS. 6A–D are operation timing diagrams of the supply voltage detection circuit of FIG. 5.
Figure 6B:
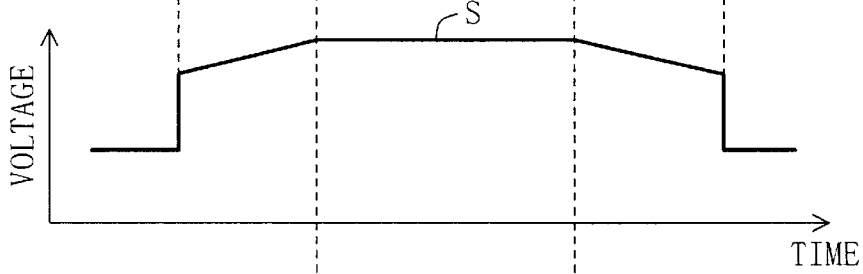
Figure 6C:
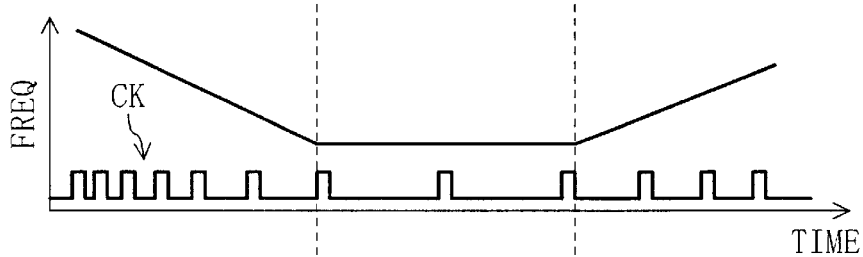
Figure 6D:
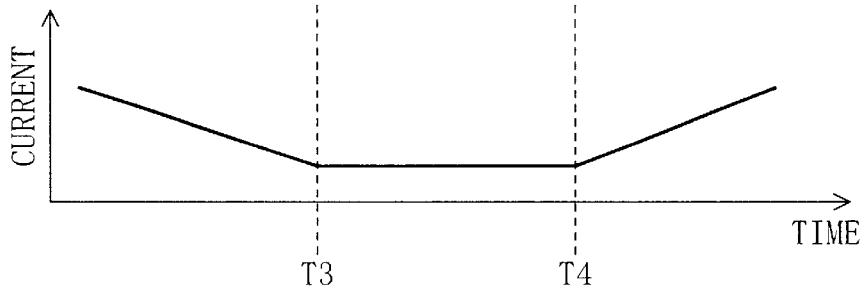

FIGS. 6A–D show the operation of the supply voltage detection circuit of FIG. 5. As shown in FIG. 6A, the detection voltage Vdet follows and varies with the supply voltage Vdd. When the detection voltage Vdet is lower than the reference voltage Vref, the comparison output S becomes "L" and, on the other hand, when the detection voltage Vdet is higher than the reference voltage Vref, the comparison output S becomes "H" (FIG. 6B). In this way, the level of the supply voltage Vdd is detected based on the high-precision reference voltage Vref generated by the reference voltage generation circuit 11. At this time, the reference voltage generation circuit 11 and the comparator 12 in FIG. 5 operate intermittently according to the clock signal CK shown in FIG. 6C. Furthermore, as the detection voltage Vdet increases the frequency of the clock signal decreases. Therefore, in the period during which the comparison output S of "H" is fixed, the periodic time of the intermittent operation increases. Accordingly, as shown in FIG. 6D, in a certain time range including the period from time T3 to time T4, the current dissipation of the reference voltage generation circuit 11 and that of the comparator 12 are considerably reduced.

As described above, with the arrangement of FIG. 5, the low voltage range including the reference voltage Vref and the high voltage range greater than the low voltage range are set for the detection voltage Vdet, and when the detection voltage Vdet falls within the high voltage range the current dissipation of the reference voltage generation circuit 11 and that of the comparator 12 are reduced in comparison with when the detection voltage Vdet falls within the low voltage range. This therefore realizes a supply voltage detection circuit capable of high detection precision/low power dissipation compatibility.

What is claimed is:

1. A supply voltage detection circuit for detecting a voltage level of a supply voltage, said supply voltage detection circuit comprising:
    a monitor circuit for supplying a detection voltage reflecting said supply voltage;
    a reference voltage generation circuit for generating a reference voltage; and
    a comparator for comparing said detection voltage with said reference voltage and outputting the result of said comparison;
    wherein said supply voltage detection circuit further comprises control means for performing control so that a current dissipation of said reference voltage generation circuit is reduced when said detection voltage is above a predetermined voltage level, and for restoring normal operation of said reference voltage generation circuit when said detection voltage falls below said predetermined voltage level.

2. The supply voltage detection circuit of claim 1, said control means including:
    an auxiliary reference voltage generation circuit for generating an auxiliary reference voltage with less power dissipation in comparison with said reference voltage generation circuit; and an auxiliary comparator for comparing said detection voltage with said auxiliary reference voltage;

wherein the operation of said reference voltage generation circuit is controlled according to the result of said comparison by said auxiliary comparator.

3. The supply voltage detection circuit of claim 2, wherein said control means further includes an oscillator for causing said reference voltage generation circuit to intermittently operate at a frequency according to the result of said comparison by said auxiliary comparator.

4. The supply voltage detection circuit of claim 3, wherein said oscillator further has a function of causing said comparator to intermittently operate at said frequency according to the result of said comparison by said auxiliary comparator.

5. The supply voltage detection circuit of claim 3, said oscillator including:

first and second clock generators for generating clock signals differing in frequency from each other; and a switch for selecting between said first clock generator and said second clock generator according to the result of said comparison by said auxiliary comparator.

6. The supply voltage detection circuit of claim 1, wherein said control means includes an oscillator for causing said reference voltage generation circuit to intermittently operate at a frequency according to said detection voltage.

7. The supply voltage detection circuit of claim 6, wherein said oscillator further has a function of causing said comparator to intermittently operate at said frequency according to said detection voltage.

8. The supply voltage detection circuit of claim 6, wherein the oscillation frequency of said oscillator is inversely proportional to said detection voltage.

9. A supply voltage detection method of detecting a voltage level of a supply voltage, said supply voltage detection method comprising the steps of:

supplying a detection voltage reflecting said supply voltage;

generating a reference voltage by a reference voltage generation circuit;

comparing said detection voltage with said reference voltage and outputting the result of said comparison; and performing control so that a current dissipation of said reference voltage generation circuit is reduced when said detection voltage is above a predetermined voltage level, and restoring normal operation of said reference voltage generation circuit when said detection voltage falls below said predetermined voltage level.

* * * * *